(12) United States Patent
Ivanov et al.

(10) Patent No.: US 8,992,748 B2
(45) Date of Patent: Mar. 31, 2015

(54) SPUTTERING TARGET

(75) Inventors: Eugene Y. Ivanov, Grove City, OH (US); Yongwen Yuan, Dublin, OH (US); David B. Smathers, Columbus, OH (US); Ronald G. Jordan, Sugar Grove, OH (US)

(73) Assignee: Tosoh SMD, Inc., Grove City, OH (US)

( * ) Notice: Subject to any disclaimer, the term of this patent is extended or adjusted under 35 U.S.C. 154(b) by 242 days.

(21) Appl. No.: 13/525,988

(22) Filed: Jun. 18, 2012

(65) Prior Publication Data

US 2012/0298506 A1 Nov. 29, 2012

Related U.S. Application Data

(63) Continuation of application No. 12/223,499, filed as application No. PCT/US2007/004879 on Feb. 26, 2007, now abandoned.

(60) Provisional application No. 60/815,635, filed on Jun. 22, 2006, provisional application No. 60/779,500, filed on Mar. 6, 2006.

(51) Int. Cl.
*C23C 14/06* (2006.01)
*C23C 14/34* (2006.01)
(Continued)

(52) U.S. Cl.
CPC ......... *C23C 14/3414* (2013.01); *H01J 37/3255* (2013.01); *H01J 37/3426* (2013.01); *C23C 14/0617* (2013.01); *H01L 2924/0002* (2013.01)
USPC .................................................... 204/298.13

(58) Field of Classification Search
CPC .............. H01J 37/3255; H01J 37/3426; C23C 14/0617; C23C 14/3414
See application file for complete search history.

(56) References Cited

U.S. PATENT DOCUMENTS 3,926,691 A 12/1975 Fustukian et al.
4,033,794 A 7/1977 Stowell et al.
(Continued)

FOREIGN PATENT DOCUMENTS

EP 0521163 1/1993
EP 0531808 3/1993
(Continued)

OTHER PUBLICATIONS

Kroc, J., Dynamic Recrystallization, Feb. 20, 2003/Last modified Jun. 1, 2003, pp. 1-5, http://home.zcu.cz/~krocj/dynamic-recrystallization.html.
(Continued)

*Primary Examiner* — Jason M Berman
(74) *Attorney, Agent, or Firm* — Wegman, Hessler & Vanderburg

(57) ABSTRACT

A sputtering target made of aluminum and one or more alloying elements including Ni, Co, Ti, V, Cr, Mn, Mo, Nb, Ta, W, and rare earth metals (REM). The addition of very small amounts of alloying element to pure aluminum and aluminum alloy target improves the uniformity of the deposited wiring films through affecting the target's recrystallization process. The range of alloying element content is 0.01 to 100 ppm by weight, which is sufficient to prevent dynamic recrystallization of pure aluminum and aluminum alloys, such as 30 ppm Si alloy. The addition of small amount of alloying elements increases the thermal stability and electromigration resistance of pure aluminum and aluminum alloys thin films while sustaining their low electrical resistivity and good etchability. This invention also provides a method of manufacturing microalloyed aluminum and aluminum alloy sputtering target.

9 Claims, 7 Drawing Sheets
(2 of 7 Drawing Sheet(s) Filed in Color)

(51) Int. Cl.
*H01J 37/32* (2006.01)
*H01J 37/34* (2006.01)

(56) References Cited

U.S. PATENT DOCUMENTS

| | | | |
|---|---|---|---|
| 4,248,715 A * | 2/1981 | Olivier | 204/260 |
| 4,477,793 A | 10/1984 | Mukae et al. | |
| 4,775,814 A | 10/1988 | Yuhara et al. | |
| 4,814,053 A | 3/1989 | Shimokawato | |
| 4,874,440 A | 10/1989 | Sawtell et al. | |
| 4,941,032 A | 7/1990 | Kobayashi et al. | |
| 4,960,163 A | 10/1990 | Fang et al. | |
| 5,229,626 A | 7/1993 | Ebitani et al. | |
| 5,273,910 A | 12/1993 | Tran et al. | |
| 5,284,532 A | 2/1994 | Skinner | |
| 5,296,653 A | 3/1994 | Kiyota et al. | |
| 5,497,255 A | 3/1996 | Yamazaki et al. | |
| 5,514,909 A | 5/1996 | Yamamoto et al. | |
| 5,541,007 A | 7/1996 | Ueda et al. | |
| 5,906,717 A | 5/1999 | Hasegawa et al. | |
| 5,982,715 A | 11/1999 | Mori et al. | |
| 6,033,542 A | 3/2000 | Yamamoto et al. | |
| 6,218,206 B1 | 4/2001 | Inoue et al. | |
| 6,252,247 B1 | 6/2001 | Sakata et al. | |
| 6,264,813 B1 | 7/2001 | Leroy et al. | |
| 6,329,275 B1 | 12/2001 | Ishigami et al. | |
| 6,423,161 B1 | 7/2002 | Yao et al. | |
| 6,929,726 B2 | 8/2005 | Watanabe et al. | |
| 6,997,995 B2 | 2/2006 | Janschek et al. | |
| 7,017,382 B2 | 3/2006 | Segal et al. | |
| 2003/0047812 A1 | 3/2003 | Hagihara et al. | |
| 2004/0126608 A1 | 7/2004 | Gotoh et al. | |
| 2005/0184395 A1 | 8/2005 | Gotoh et al. | |

FOREIGN PATENT DOCUMENTS

| | | | |
|---|---|---|---|
| EP | 0573002 A1 | 12/1993 | |
| EP | 0778624 | 6/1997 | |
| EP | 1553205 A1 | 7/2005 | |
| FR | 2555611 | 5/1985 | |
| JP | 55157238 | 12/1980 | |
| JP | 61061257 | 12/1986 | |
| JP | 62235451 A | 10/1987 | |
| JP | 62235451 A * | 10/1987 | |
| JP | 1134426 | 5/1989 | |
| JP | 1233737 | 9/1989 | |
| JP | 01289140 | 11/1989 | |
| JP | 2159064 | 6/1990 | |
| JP | 2188922 | 7/1990 | |
| JP | 04056136 | 2/1992 | |
| JP | 4192332 | 7/1992 | |
| JP | 5335271 | 12/1993 | |
| JP | 6333926 | 12/1994 | |
| JP | 10330927 A | 12/1998 | |
| JP | 10330928 A | 12/1998 | |
| JP | 11337976 | 12/1999 | |
| JP | 2001093862 | 4/2001 | |
| JP | 2001316803 | 11/2001 | |
| JP | 2002173724 A * | 6/2002 | |
| JP | 2004055842 | 2/2004 | |
| SU | 1160896 A1 | 10/1991 | |
| WO | WO9213360 | 8/1992 | |
| WO | WO0173156 A2 | 10/2001 | |
| WO | WO2004042104 A2 | 5/2004 | |
| WO | WO2006041989 | 4/2006 | |

OTHER PUBLICATIONS

6. Dynamic Recrystallization: Multiple Peak and Monotonic Stress Behavior 6.1 An Introduction to Dynamic Recrystallization http://www.tdr.cesca.es/TESIS_UPC/AVAILABLE/TDX-0104105-092144/09Vggf09de11.pdf.

Murr, L. E., Interfacial Phenomena in Metals and Alloys, 1975, pp. 322-338 Addison-Wesley, Reading, MA.

Onishi et al., "Developments in Al—Nd Alloy Interconnections and Sputtering Targets for Liquid Crystal Displays", Kobe Steel Engineering Reports, Dec. 1998, pp. 29-34, vol. 48, No. 3.

Yamagata, H., "Dynamic recrystallization and dynamic recovery in pure aluminum at 583K", Acta Metall. Mater., 1995, pp. 723-729, vol. 43, No. 2.

Lee, Y. K. et al., "Annealing behavior of Al—Y alloy film for interconnection conductor in microelectronic devices", J. Vac. Sci. Technol., Sep./Oct. 1991, pp. 2542-2547, vol. 9, No. 5.

Van Horn, Kent R. (editor), Aluminum Volume I Properties, Physical Metallurgy and Phase Diagrams, Nov. 1971, pp. 174-176, American Society for Metals, Metals Park, Ohio.

Gschneidner, Jr. et al., "Rare Earth Metals", ASM Handbook (Formerly Tenth Edition, Metals Handbook) vol. 2, Jan. 1992, ASM International, USA.

Joshi, et al., "Aluminum—samarium alloy for interconnections in integrated circuits", J. Vac. Sci. Technol., May/Jun. 1990, pp. 1480-1483, vol. 8, No. 3.

Koleshko et al., Physical Effects in Metallic Films of Submicron Dimensions and Ways of Improving the Reliability and Durability of Interconnections in Large-Scale Integrated Circuits, 1982, pp. 99-107.

Wiedemann-Franz law, Wikipedia, http://en.wikipedia.org/wiki/Wiedemann-Franz_law.

Hawksworth, A., et al., "Solidification microstructure selection in the Al-rich Al—La, Al—Ce and Al—Nd systems", Journal of Crystal Growth, Feb. 1, 1999, pp. 286-296, vol. 197, No. 1-2, Elsevier, Amsterdam, NL.

Hyde, K. B., et al., "The growth morphology and nucleation mechanism of primary L12Al3Sc particles in Al—Sc alloys", Materials Science Forum, 2000, pp. 1013-1018, vol. 331-337.

International Search Report and Written Opinion mailed Sep. 4, 2007 for PCT/US2007/004879 filed Feb. 26, 2007.

International Preliminary Report on Patentability mailed Sep. 18, 2008 for PCT/US2007/004879 filed Feb. 26, 2007.

International Search Report and Written Opinion mailed Jun. 21, 2006 for PCT/US2005/035940 filed Oct. 4, 2005.

International Preliminary Report on Patentability mailed Apr. 19, 2007 for PCT/US2005/035940 filed Oct. 4, 2005.

International Search Report and Written Opinion mailed Sep. 14, 2007 for PCT/US2007/004490 filed Feb. 21, 2007.

International Preliminary Report on Patentability mailed Sep. 18, 2008 for PCT/US2007/004490 filed Feb. 21, 2007.

* cited by examiner

SPUTTERING TARGET

CROSS-REFERENCE TO RELATED APPLICATIONS

This application is a continuation of U.S. National Phase patent application Ser. No. 12/223,499 filed on Jul. 31, 2008, which, in turn, is the U.S. National Phase Application of International Patent Application No. PCT/US2007/004879 filed on Feb. 26, 2007, which, in turn, claims priority benefit of U.S. Provisional Patent Application Ser. No. 60/815,635 filed Jun. 22, 2006 and U.S. Provisional Patent Application Ser. No. 60/779,500 filed Mar. 6, 2006.

FIELD OF THE INVENTION

The invention relates to a sputtering target suitable for forming wiring films of improved uniformity, thermal stability, and electromigration resistance for semiconductor integrated circuit devices and flat panel displays. It particularly relates to pure aluminum and aluminum alloy sputtering targets containing a small amount of alloying elements.

BACKGROUND OF THE INVENTION

Aluminum wiring film formed by a sputtering method has been widely used in semiconductor integrated circuits and flat panel displays due to its low resistivity, good etchability, and low manufacturing cost. Low resistivity and high thermal conductivity lead to low resistance-capacitance (R-C) delay associated with the interconnection network. R-C delay is a critical factor in determining the signal propagation speed or the time constant in the devices and circuits. For example, it is necessary to maintain a low time constant and keep an electrical resistivity below 5 $\mu\Omega\cdot cm$ and even below 3 $\mu\Omega\cdot cm$ for the wiring films connecting the sources and drains of the amorphous thin film transistors (TFT) of liquid crystal displays (LCD) to sustain desirable display quality and power consumption when the size of the display panel becomes large.

For many applications it is critical that the wiring film is of uniform thickness over the entire deposited substrate. This is especially true for large-scale integrated circuits consisting of multiple layers of multilevel structure having feature size of 1 micrometer or less. The production of a single multilevel structure involves several sputtering and patterning process including depositing and patterning dielectric material, depositing a diffusion barrier layer, and depositing and patterning a conductive wiring film. The variation in wiring film thickness not only causes inconsistent signal propagation speed and power consumption due to the varied film sheet resistance (Rs), which is inversely proportional to the film thickness, but also adversely affects the performance of the layers built on the wiring film or even causes short circuits between the conductive wire films as a result of the formation of large film bumps-hillocks.

The thickness uniformity of wiring films is believed to be directly influenced by the structural characteristics of the sputtering target including grain size, orientation, and the uniformity of their distribution. The target grain structure is typically controlled through controlling its fabrication process consisting of mechanical deformation and thermal anneals. A key step to form desirable target grain structure is to accumulate sufficient and uniformly distributed internal energy in the deformation process (roll, press, forge, extrusion or their combination). The internal energy is the driving force for the grain refinement in the recrystallization anneal process. However, it has been observed that high purity aluminum (5N or higher purity) can undergo a dynamic recrystallization during a hot deformation. One of the consequences of the dynamic recrystallization is that the internal energy is partially lost. The grain refinement process in the subsequent static recrystallization process can be incomplete or never happen due to insufficient internal energy. The other consequence of the dynamic recrystallization is the formation of non strain-free recrystallization grains dispersed in the deformed matrix of high dislocation density. This kind of nonuniform partial recrystallization structure results in considerable variations in the thickness or flatness characteristics of the deposited films because the recrystallization grains and deformed matrix have different sputtering behaviors.

An issue associated with the applications of pure aluminum film is its low electromigration resistance and thermal stability. Many aluminum wiring film failures are caused by the electromigration which occurs and leads to a directional mass transport associated with atomic flux divergence when the wiring film is subjected to high current densities. Voids or hillocks form in the films of low thermal stability subjected to a thermal treatment or a joule heat generated by a high current density. In general, the electromigration resistance increases with increasing thermal stability. A common solution to enhance the thermal stability and electromigration is to alloy the aluminum. Adding up to 0.1 wt % Cu, Fe, Ti, and B alloying elements to the pure aluminum target has been reported to improve the thermal stability of the deposited films. However, alloying aluminum with impurity elements can increase the electrical resistivity of aluminum. On the other hand, adding alloying impurities to aluminum degrades the etchability of aluminum. The commonly used Al alloying element Cu can deteriorate the patternability of Al because the Cu and Al can form very stable intermetallic precipitates which are difficult to be removed by Al etching reactant, and the etching reactant suitable for Al will react with Cu to form compounds that are insoluble in the commonly used cleaning solvents.

Accordingly, there is an ever-increasing demand to develop an aluminum or aluminum alloy target resulting in wiring films with improved uniformity, electromigration resistance, and thermal stability while maintaining low resistivity and good etchability to meet the needs of current and future in semiconductor electronic devices and flat panel display applications.

SUMMARY OF THE INVENTION

The present inventors have discovered an aluminum or aluminum alloy sputtering target containing 0.01 to 100 ppm one or more of other elements or secondary alloying elements including Ni, Co, Ti, V, Cr, Mn, Mo, Nb, Ta, W, and rare earth metals (REM), and provided a manufacturing method for such a sputtering target.

The present invention provides a method to improve the performance of the films formed from the aluminum and aluminum alloy sputtering targets. The addition of alloying elements including but not limited to Ni, Co, Ti, V, Cr, Mn, Mo, Nb, Ta, W, and rare earth metals (REM), to aluminum or aluminum alloy target improves the uniformity of the deposited films. Adding alloying elements particularly Ni and Nd raises the recrystallization temperature of pure aluminum or aluminum alloys, effectively suppresses the dynamic recrystallization in hot deformed aluminum or aluminum alloys, and accumulates the internal energy driving the nucleation of new grains in the static recrystallization for cold worked aluminum or aluminum alloys. Our data showed that even several ppm of Cu or Fe did not prevent the dynamic recrystallization in pure aluminum and aluminum-30 ppm Si alloy but as low as 0.1~0.3 ppm Ni addition effectively restricts the dynamic recrystallization during the hot deformation of aluminum or aluminum-30 ppm Si alloy. We have discovered that the dynamic recrystallization is a source causing nonuniform grain structure and thus poor uniformity for the deposited films.

Small additions of secondary elements with surface-active properties to aluminum or aluminum alloys result in crystalline grain refinement of the deposited film and improvement in its thermal stability, electromigration resistance, and hillock resistance. A small amount of alloying element addition to aluminum or aluminum alloys does not change the resistivity and etchability of the deposited films.

BRIEF DESCRIPTION OF THE FIGURES

The patent or application file contains at least one drawing executed in color. Copies of this patent or patent application publication with color drawing(s) will be provided by the Office upon request and payment of the necessary fee.

The below detailed description makes reference to the accompanying figures, in which:

Figure 1:
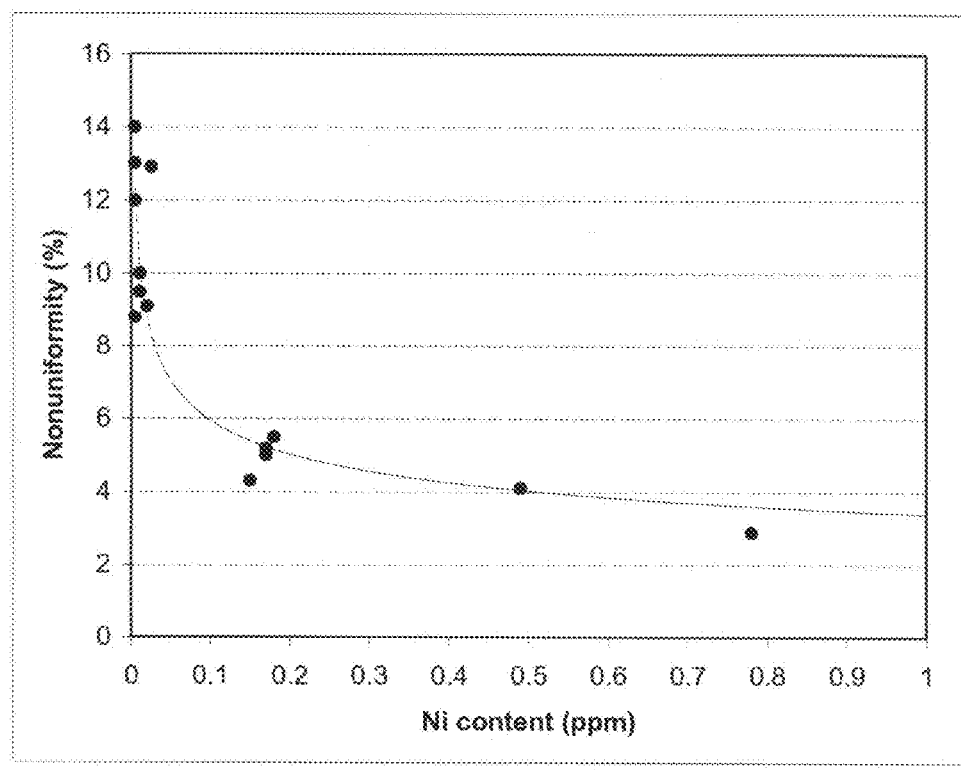

The below detailed description makes reference to the accompanying figures, in which:

FIG. 1 plots the film nonuniformity as a function of Ni content. The dot-dashed line is an eye guideline.

Figure 2:
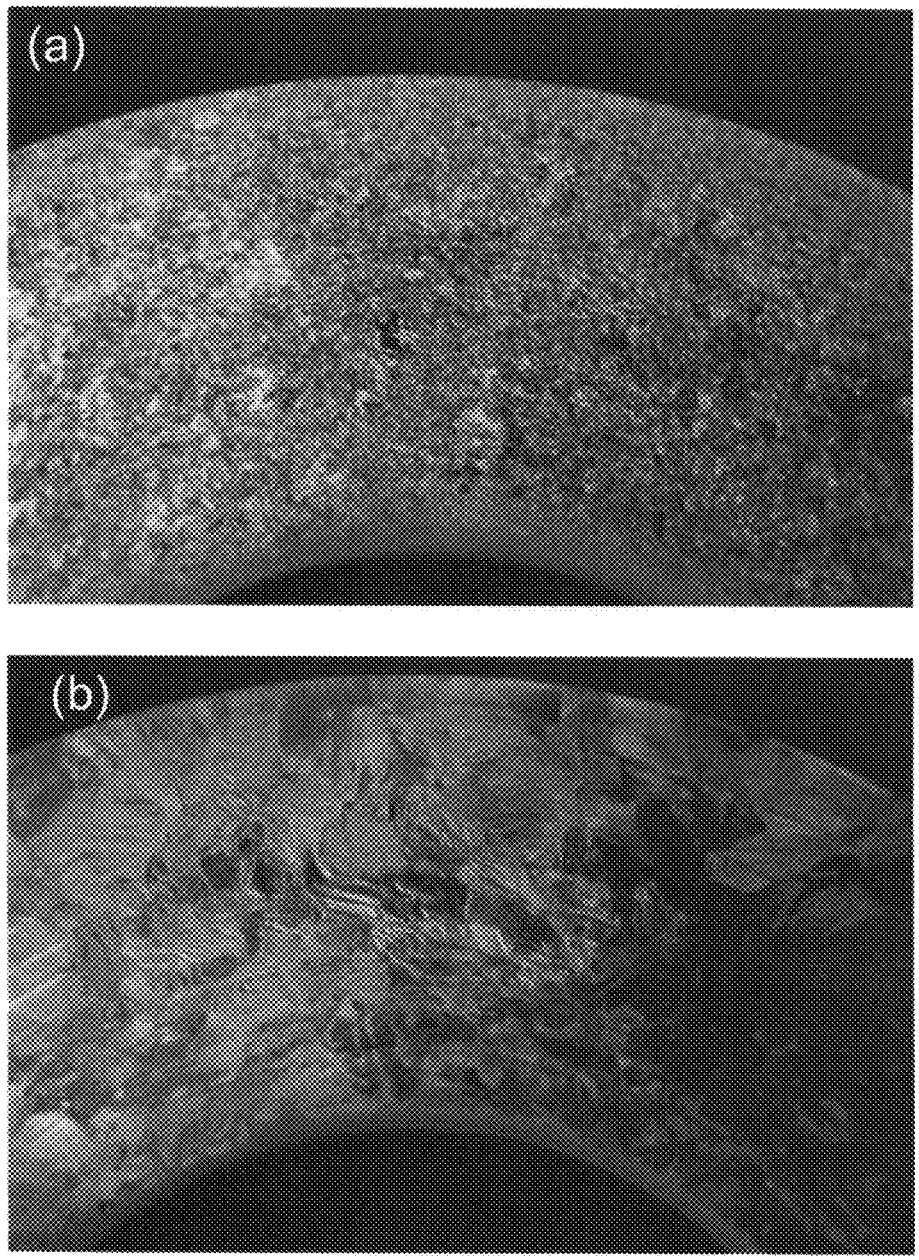

FIG. 2 is the photographs of the sputtered surface of (a) an Al-30 ppm Si ConMag target and (b) an Al-30 ppm Si ConMag target with 4 ppm Ni addition. The target without Ni addition consists of finer grains size compared to the target with Ni addition, which maintains coarse ingot grains containing deformed bands. The photos were taken after the targets had been sputtered for the first 50 wafers.

Figure 3:
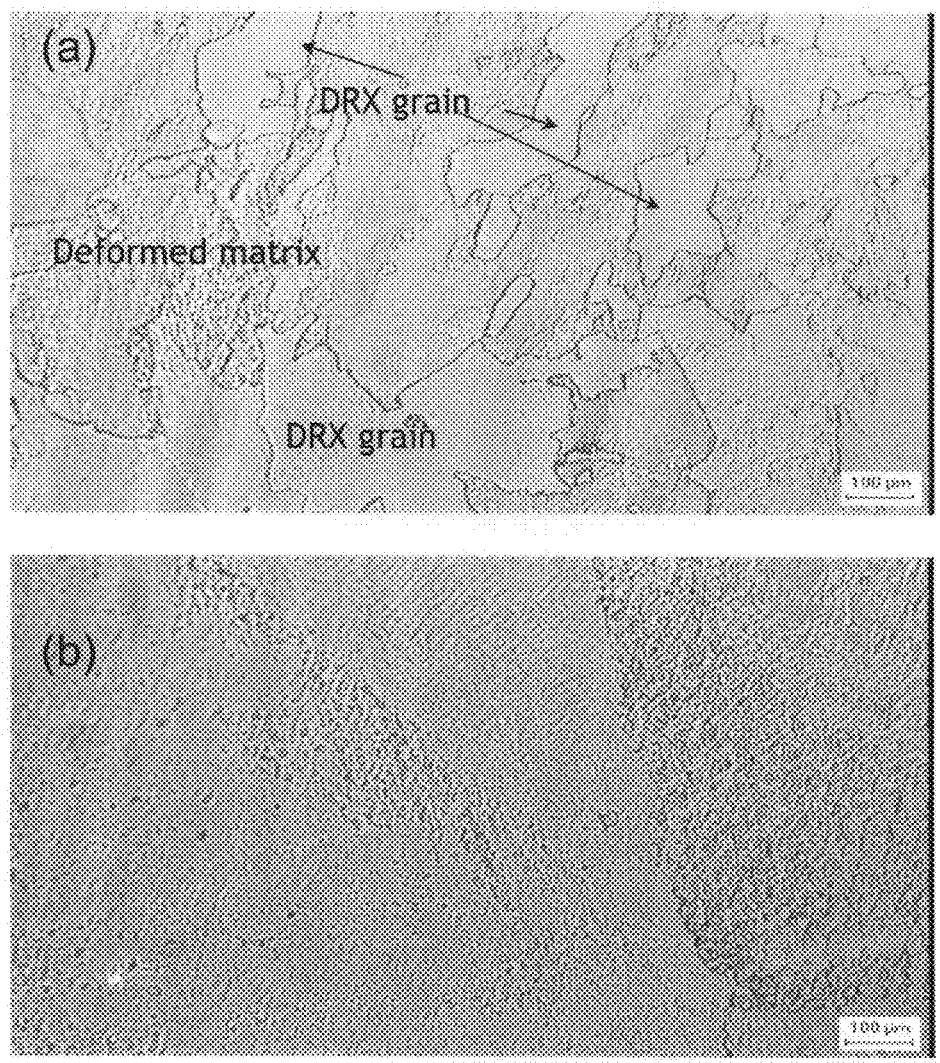

FIG. 3 is the metallographs of the targets (a) without Ni addition and (b) with 4 ppm Ni. The target without Ni addition contains dynamic recrystallization (DRX) grains having serrated grain boundaries and subgrain boundaries.

Figure 4:
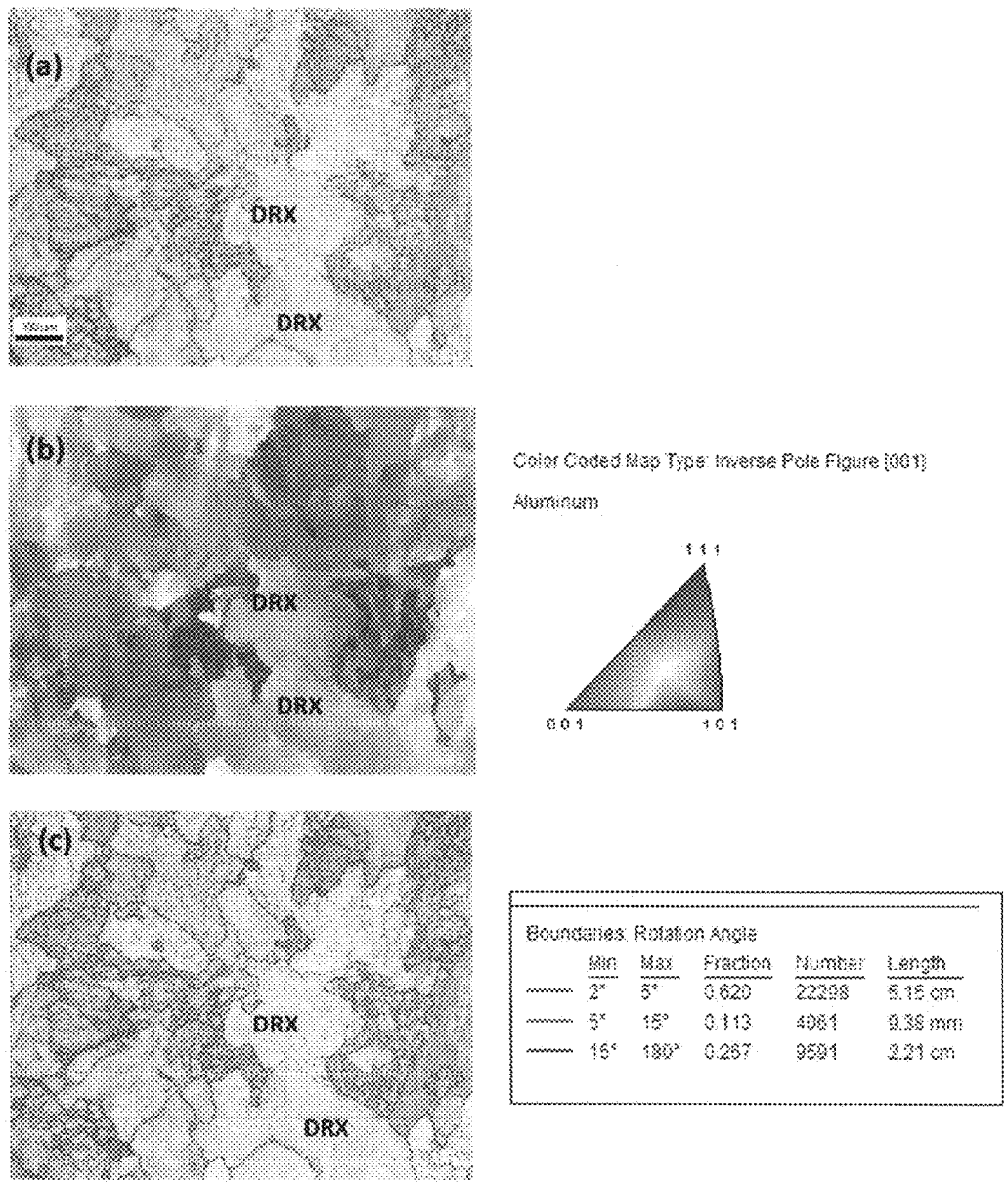

FIG. 4 is (a) SEM, (b) OIM inverse pole figure (IPF) map, and (c) OIM misorientation map of an Al-30 ppm Si ConMag target. These images indicate dynamic recrystallization (DRX) grains with serrated grain boundaries and subgrain boundaries form within the deformed original grains. The DRX grains have a much lower density of low angle subgrain boundaries than the deformed matrix.

Figure 5:
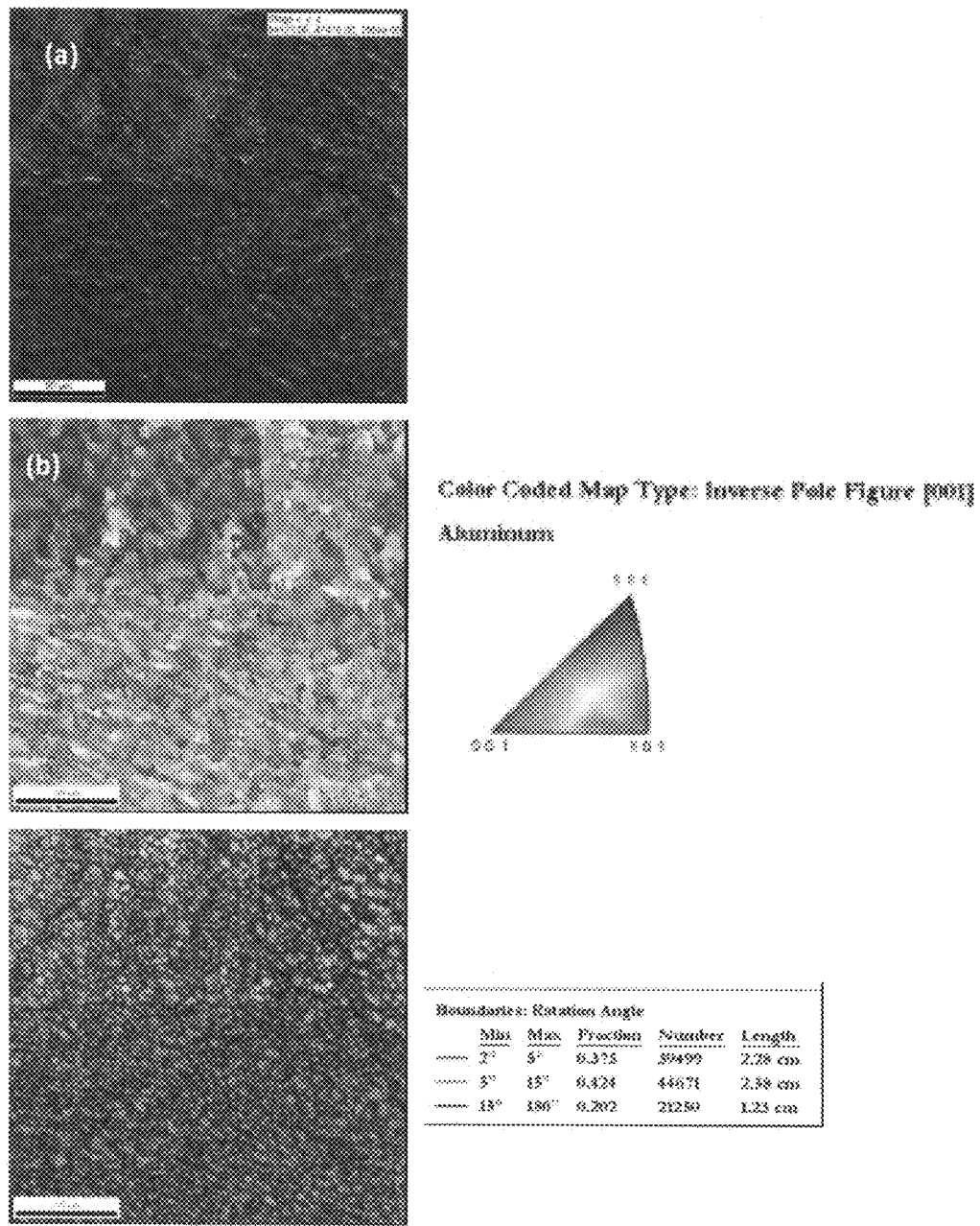

FIG. 5 is (a) SEM, (b) OIM inverse pole figure (IPF) map, and (c) OIM misorientation map for a grain triple junction of a Ni alloyed Al-30 ppm Si ConMag target. These images show the Ni microalloyed target is free of dynamic recrystallization grains. The IPF and OIM maps indicate that low angle subgrain boundaries consisting of dislocations exist within the deformed original grains consisting of large angle grain boundaries.

Figure 6:
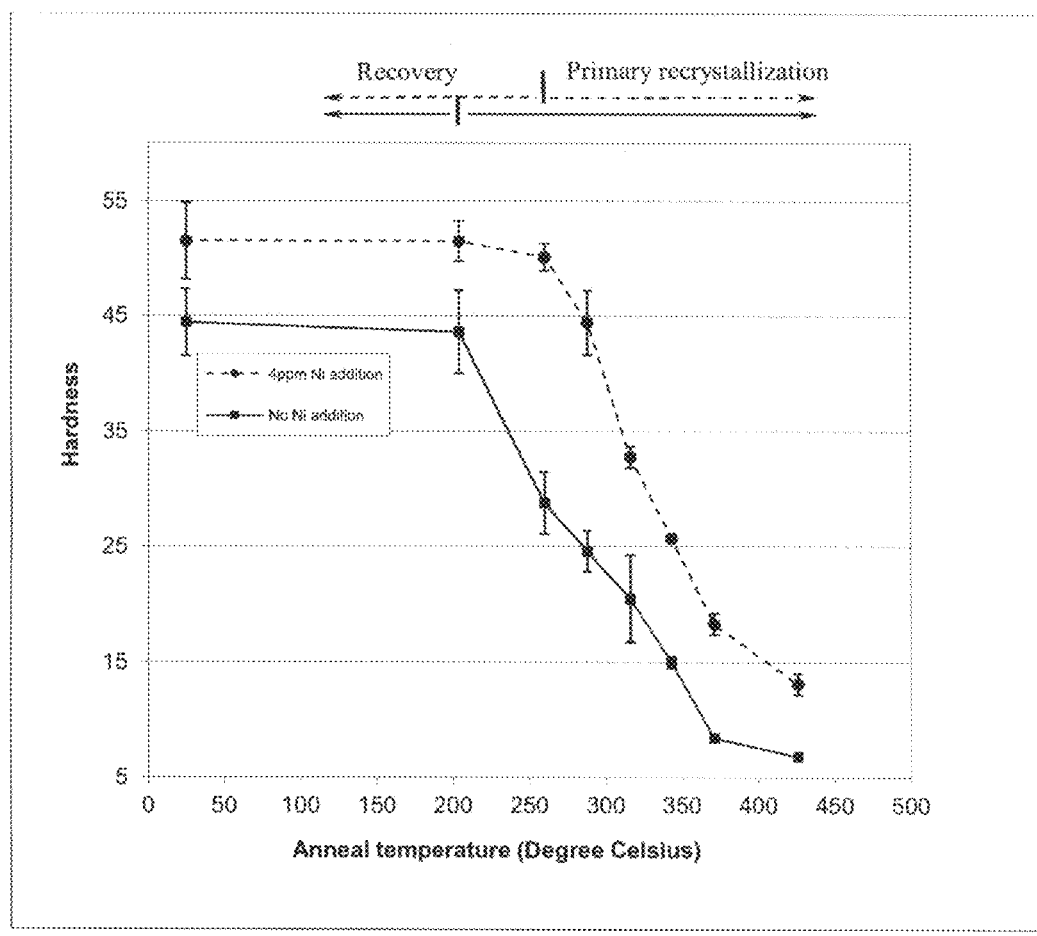

FIG. 6 plots the hardness as a function of anneal temperature for Al-30 ppm Si targets with and without Ni addition. Hardness is measured using 15 kg load and 1/8" ball. The Ni addition increases the hardness and recrystallization temperature of aluminum-30 ppm Si alloy.

Figure 7:
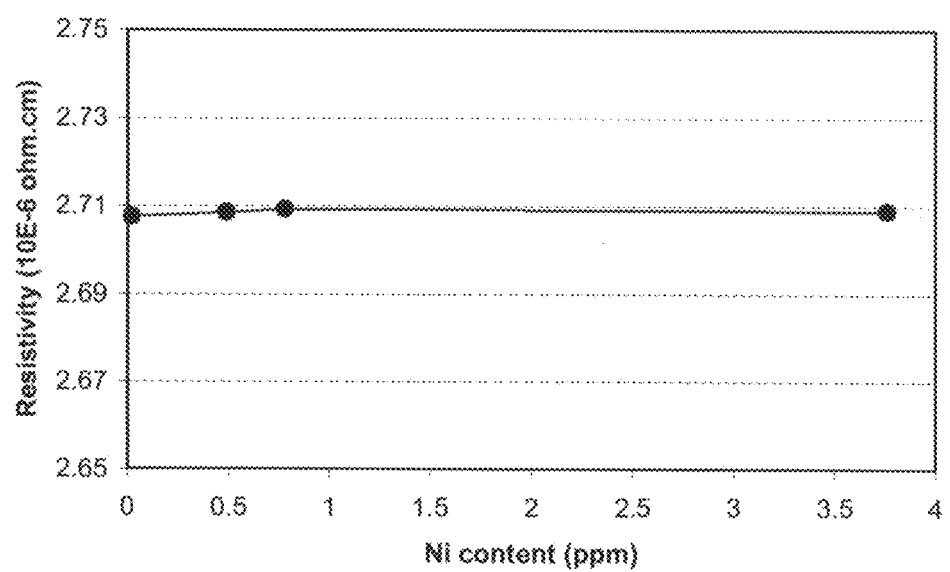

FIG. 7 is resistivity of aluminum-30 ppm Si as a function of Ni content.

DETAILED DESCRIPTION OF THE PREFERRED EMBODIMENTS

The aluminum and its alloy sputtering target encompassed by this invention can have any suitable geometry. The present invention includes a method of manufacturing the aluminum and its alloy target containing one or more of alloying elements Ni, Co, Ti, V, Cr, Mn, Mo, Nb, Ta, W, and rare earth metals (REM). The aluminum raw material will preferably have a purity of 99.999 wt %. The Ni raw material will preferably have a purity of at least 99.95 wt %. The Co raw material will preferably have a purity of 99.95 wt %. The Ti raw material will preferably have a purity of 99.995 wt %. The V raw material will preferably have a purity of 99.5 wt %. The Cr will preferably have a purity of at least 99.9 wt %. The Mn will preferably have a purity of at least 99.9 wt %. The Mo will preferably have a purity of at least 99.95 wt %. The Ta will preferably have a purity of at least 99.95 wt %. The W will preferably have a purity of at least 99.95 wt %. The aluminum, or aluminum and its primary alloying elements including Si and Cu, and one or more of other alloying elements Ni, Co, Ti, V, Cr, Mn, Mo, Nb, Ta, W, and rare earth metals (REM) are melted to form a molten alloy preferably through a vacuum induction melting or continuous casting process. The molten alloy is subsequently cooled and cast to form ingot of aluminum or aluminum alloy containing one or more of alloying elements including Ni, Co, Ti, V, Cr, Mn, Mo, Nb, Ta, W, and rare earth metals (REM). It should be understood that the secondary alloying elements in the aluminum or its alloy of the present invention can range from 0.01 to 100 ppm weight. The resulting ingot can have any size and any suitable shapes including round, square, and rectangular. The ingot of aluminum alloying with a small amount of one or more of alloying elements undergoes a thermomechanical process to form desirable grain structure. The thermomechanical process includes but is not limited to hot or cold roll, hot or cold press, hot or cold forge, and anneals to form plate or blank. The plate or blank of aluminum alloy is machined into a target with different geometry.

An exemplary aluminum-30 ppm Si ConMag target alloyed with less than 10 ppm Ni has been produced according to the process described above. The Al of 99.999% purity is melted with a prescribed amount of Si of 99.999% or higher purity and Ni of 99.5% purity to produce an ingot with a preferable diameter from 75 mm to 200 mm by use of the vacuum induction melting method. The composition of the resulting ingot measured by the GDMS method is listed in the Table 1. (The weight concentration unit is ppm for all elements). The ingot is sawn into ingot slices of desirable heights. The ingot slice is subjected to anneal in a temperature range of 250° C. to 600° C. for a time period up to 6 hours. The ingot slice subsequently goes through a hot deformation of 40%~80% reduction at a temperature range of 200° C. to 600° C. to make a blank. The blank is machined to a ConMag target of conical shape with or without an anneal. For comparison, an aluminum-30 ppm Si ConMag target without Ni addition has been produced by the same fabrication process. Table 1 compares the compositions of these two targets. The only difference between them is their Ni content, i.e., one is essentially a pure aluminum-30 ppm Si alloy. The other one is aluminum-30 ppm Si alloyed with ~4 ppm Ni.

Sputtering has been performed on these two targets. The major sputtering conditions are listed in Table 2. The film nonuniformity is characterized using 9-point approach. The measurement indicates the nonuniformity is 14% for the films deposited from the target without Ni addition. The nonuniformity is 4% for the films deposited from the Ni alloyed target. It clearly shows a small amount of Ni addition significantly improves the film uniformity performance. A series of targets with varied Ni contents have been produced and sputtered using the above process and conditions. FIG. 1 plots the film nonuniformity as a function of Ni contents in aluminum- 30 ppm Si alloy. It indicates the film nonuniformity decreases with increasing Ni contents. The film nonuniformity is dramatically improved with Ni addition as low as 0.2 ppm.

The structure examination reveals that the film nonuniformity is correlated to the target structure. After a short time period of sputtering (the first 50 wafers), we discovered the targets with Ni addition appeared to have nonrecrystallization structure while the targets without Ni addition appeared to have partial recrystallization structure. FIG. 2 exemplifies the macrostructure of the target with ~4 ppm Ni and the target without Ni addition. The Ni alloyed target consists of well-defined non-recrystallization coarse grains containing deformation bands. In contrast, the target without Ni addition consists of fine and partial recrystallization grains.

The difference in structure for the targets with and without Ni additions is further confirmed by microstructure and texture examinations. As shown in FIG. 3, the target with Ni addition displays a highly deformed grain structure of high dislocation density and internal energy, a typical recovery structure of metallic materials after mechanical deformation while prior to the recrystallization stage. In contrast, for the target without Ni addition, grains with serrated grain boundaries and subgrains apparently reformed from the deformed grain matrix. The formation of non-strain-free grains with subgrains is the characteristic microstructure feature of dynamic recrystallization. These dynamic recrystallization grains distinguish from those strain-free static recrystallization grains of equalaxed shapes normally forming in the metallic materials after deformation, i.e., the target without Ni addition undergoes a dynamic recrystallization process involving in both grain nucleation and growth rather than the common static recrystallization.

The head to head metallograph comparison between pure aluminum-30 ppm Si and Ni microalloyed Al-30 ppm Si targets indicates that the Ni addition suppresses the dynamic recrystallization in the aluminum-30 ppmSi target (FIG. 3). The orientation imaging microscope (OIM) images further confirm there are numerous low angle subgrain boundaries existing within the deformed grains of Ni microalloyed target (FIG. 4). A low angle grain boundary usually consists of dislocations. The presence of low angle subgrain boundaries of the grains in Ni microalloyed target suggests that the dislocations are piled up and pined at the subgrain boundaries during the hot deformation process. The dynamic recrystallization is suppressed due to the immobile subgrain boundaries. If the cold deformation were applied on the Ni-microalloyed materials, the internal energy stored in the subgrain boundaries of high density dislocation would drive the static recrystallization process to form uniform and fine grain structure. During the dynamic recrystallization process, new grains form to reduce the internal energy stored in the high dislocation density areas within the deformed grains. As shown in FIG. 5, there is much lower density of low angle subgrain boundaries consisting of dislocations in the newly formed dynamic recrystallization grains than the deformed matrix. This confirms that dynamic recrystallization grains and deformed matrix have different dislocation density or internal energy. In other words, the dynamic recrystallization process consumes the internal energy stored in the deformed domains of dislocation density areas. The grain orientation and atom mobility should be different between the reformed dynamic recrystallization grains and the deformed matrix of high dislocation density and internal energy. Thus, it is not surprising that local sputtering rates are different between recrystallization grains and deformed matrix for a target subjected to a dynamic recrystallization process. As a result, the films deposited from such a target will have considerable variations in film thickness or poor film uniformity. On the other hand, the Ni microalloyed target is free of dynamic recrystallization structure. The whole target has consistent sputtering performance due to its uniform and consistent grain structure so the films deposited from the Ni microalloyed target have good film uniformity.

Through-process examinations have revealed that the dynamic recrystallization takes place during hot deformation. The metallic materials subjected to a mechanical deformation will experience a plastic deformation produced by the motion of dislocations. Dislocations can be piled up when they encounter obstacles such as grain boundaries, subgrain boundaries, and precipitates during the deformation process. This enables the deformed material to convert the mechanic work to its internal energy stored at the areas of high dislocation density. The stored internal energy is the driving force for the recrystallization process. The atoms in the areas of high dislocation density are in a high energy state and unstable. They tend to be easily removed by high-energy incident ions during sputtering. Therefore the target with this kind of highly deformed and not recrystallized structure is suitable for sputtering. However, aluminum has face centered cubic (FCC) crystallographic structure and multiple {111}<110> dislocation slip systems. A perfect dislocation moving along one slip system can glide to another equivalent slip system. The consequence of the cross-slip of dislocation is that a perfect dislocation a/2<110> decomposes into two partial dislocations a/6<112>, where a is the lattice parameter of aluminum, and a region of stacking fault is created between the partial dislocations. In fact, aluminum has much higher stacking fault energy (166 mJ/mm$^2$) than other FCC materials like copper (78 mJ/mm$^2$) and gold (45 mJ/mm$^2$). If the stacking fault energy of pure aluminum or aluminum-30 ppm silicon materials can not be lowered during the target metallurgical and thermomechanical process, the deformed aluminum or Al-30 ppm Si material will not be able to accumulate enough internal energy for the material as a whole to conduct the recrystallization after the deformation process because the dislocations are difficult to be pinned and piled up due to their cross-slip movement. However, local grain nucleation can take place when a critical internal energy has been reached at high temperature (hot deformation). In addition, the grain boundaries consisting of dislocations have high mobility. High grain boundary migration results in the growth of newly formed grains in local regions during hot deformation.

A process involving both grain nucleation and growth is the characteristic of the dynamic recrystallization. The difference in microstructure nature between dynamically recrystallized grains and deformed matrix present in the target without Ni addition results in the high nonuniformity of thickness and electrical resistance for the deposited films. This invention has discovered that adding secondary alloying elements including Ni to pure aluminum or its alloy effectively suppresses the dynamic recrystallization for hot worked aluminum or its alloy and enhances the static recrystallization for cold worked aluminum or its alloy.

Lower thermal stability or abnormal growth in the deposited film is one of the major concerns associated with the utilization of pure aluminum sputtering target in forming wiring films. Low thermal stability or abnormal growth is characterized by a tendency of the individual crystal grains to grow when exposed to certain temperature. The higher the recrystallization or grain growth temperature, the higher the thermal stability. High thermal stability or low abnormal growth enhances the electromigration resistance and hillock resistance of the deposited films. FIG. 6 plots the hardness as a function of anneal temperature for aluminum-30 ppm Si targets with and without Ni addition. These targets were produced by the fabrication process described above. They were subjected to a hot deformation of 60% thickness reduction followed by a recrystallization anneal for 1 hour at a temperature ranging from 200° C. to 450° C. FIG. 6 indicates the Ni addition increases the hardness of the aluminum −30 ppm Si material. Furthermore, the hardness decreases with increasing anneal temperature for the targets with or without Ni addition. The materials are softened and the hardness decreases when the work-hardening stress is released by forming new strain-free grains in the recrystallization process. With reference to FIG. 6, the hardness declines suggest the recrystallization starting temperatures are about 260° C. and 200° C. for aluminum-30 ppm Si alloy with and without Ni addition, respectively. The recrystallization temperature of Ni microalloyed aluminum-30 ppm Si is 60° higher than that of non-Ni microalloyed aluminum-30 ppm Si. This indicates the Ni addition increases the recrystallization temperature and improves the thermal stability and electromigration resistance of aluminum and its alloys. Similar improvement in thermal stability and electromigration resistance can be attained in the aluminum by adding one or more of other elements including Co, Ti, V, Cr, Mn, Mo, Nb, Ta, W, and rare earth metals (REM). Alloying aluminum or its alloy targets with other secondary elements provides an approach to effectively enhance thermal stability and electromigration resistance. This enables the deposited films to have improved thermal stability, electromigration resistance, and hillock resistance.

Low resistivity and good etchability are desirable for wiring film applications. Our data also shows alloying aluminum or its alloys with a small amount of secondary elements does not significantly change the resistivity and patternability of the microalloyed aluminum and its alloys. FIG. 7 plots the resistivity of aluminum-30 ppm Si as a function of the content of Ni addition. It shows the resisitivity of Ni alloyed aluminum-30 ppm Si essentially does not change by adding a small amount of Ni. For example, the resistivity of aluminum-30 ppm Si with 4 ppm Ni is 2.71 micro-Ohm·cm, essentially the same as that of pure aluminum. In addition, the Ni addition does not react with the Al etching reactant. The films deposited from Ni microalloyed target sustain the etchability comparable to pure aluminum.

TABLE 1

| Element | Al—30 ppm Si | Al—30 ppm Si with Ni addition |
|---|---|---|
| Si | 30.3 | 30.5 |
| C | 0.072 | 0.12 |
| O | 0.58 | 0.48 |
| S | 0.007 | 0.007 |
| B | 0.13 | 0.13 |
| Na | 0.01 | 0.009 |
| Mg | 0.3 | 0.26 |
| P | 0.19 | 0.17 |
| Cl | 0.072 | 0.13 |
| Ca | <0.05 | 0.11 |
| Ti | 0.069 | 0.058 |
| V | 0.029 | 0.024 |
| Cr | 0.063 | 0.044 |
| Mn | 0.044 | 0.04 |

| Element | Al—30 ppm Si | Al—30 ppm Si with Ni addition |
|---|---|---|
| Zr | 0.01 | <0.005 |
| Nb | 0.004 | <0.002 |
| Mo | <0.005 | 0.22 |
| Pd | <0.005 | <0.005 |
| Cd | <0.01 | <0.01 |
| In | <0.005 | <0.005 |
| Sn | <0.05 | <0.05 |
| Sb | <0.005 | <0.005 |
| Te | <0.04 | <0.04 |
| Cs | <0.003 | <0.003 |
| Ba | <0.003 | <0.003 |
| La | 0.019 | 0.021 |
| Ce | 0.009 | 0.005 |
| W | <0.005 | 0.033 |

TABLE 1-continued

| Element | Al—30 ppm Si | Al—30 ppm Si with Ni addition |
|---|---|---|
| Fe | 0.18 | 0.15 |
| Co | <0.002 | 0.005 |
| Ni | 0.02 | 3.76 |
| Zn | 0.035 | 0.038 |
| Ga | <0.01 | <0.01 |
| Ge | <0.02 | <0.02 |
| As | <0.005 | <0.005 |
| Se | <0.02 | <0.03 |
| Rb | <0.005 | <0.005 |

| Element | Al—30 ppm Si | Al—30 ppm Si with Ni addition |
|---|---|---|
| Pt | <0.005 | 0.1 |
| Au | <0.02 | <0.02 |
| Hg | <0.005 | <0.005 |
| Tl | <0.005 | <0.005 |
| Pb | 0.009 | <0.005 |
| Bi | <0.002 | <0.002 |
| Th | 0.0012 | 0.001 |
| U | <0.001 | <0.001 |

TABLE 2

Sputter Conditions

| | |
|---|---|
| Power | 8.4 KW |
| Target/substrate distance | 7.05 cm |
| Chamber argon pressure | 6 Mt |
| Starting chamber pressure | 0.0002 mT |
| Deposition time | 55 seconds |
| Substrate temperature | 250 degree Celsius |
| Shutter delay | 2.5 second |
| Ramp time | 2.5 second |
| Film uniformity measurement | 9-point approach |

The present invention has been disclosed in connection with the preferred embodiments thereof, it should be understood that the invention is not limited to the specific embodiments described since the means herein comprise preferred forms of putting the invention into effect, and other embodiments may be within the scope of the invention as defined by the following claims.

What is claimed is:

1. An Al alloy sputter target, said sputter target consisting essentially of:
   (a) Al having a purity of at least 99.999 wt %;
   (b) Si; and
   (c) Ni, said Ni being present in said target in an amount of about 0.2-10 ppm and adapted to suppress dynamic recrystallization of said sputter target.

2. The sputter target as recited in claim 1 wherein Si is present in an amount of about 30 ppm.

3. The sputter target as recited in claim 2 wherein said sputter target is capable of producing an Al film soluble in an Al etching reactant.

4. The sputter target as recited in claim 3 wherein said Ni is present in an amount of about 4 ppm.

5. The sputter target as recited in claim 3 having a recrystallization temperature of about 60° higher than that of a non-Ni Al-30 ppm Si target.

6. The sputter target as recited in claim 2 having a resistivity of about 2.71 micro-ohm cm.

7. The sputter target as recited in claim 1 wherein said sputter target is subjected to a hot deformation process.

8. The sputter target as recited in claim 7 wherein said sputter target is comprised of coarse grains greater than 100 μm.

9. The sputter target as recited in claim 8 wherein said sputter target is further comprised of fine subgrains with low angle subgrain boundaries within said coarse grains.

* * * * *